(12) United States Patent
Templier et al.

(10) Patent No.: US 12,322,741 B2
(45) Date of Patent: Jun. 3, 2025

(54) OPTOELECTRONIC DEVICE MANUFACTURING METHOD

(71) Applicant: Commissariat à l'Énergie Atomique et aux Énergies Alternatives, Paris (FR)

(72) Inventors: François Templier, Grenoble (FR); Sébastien Becker, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 483 days.

(21) Appl. No.: 17/741,238

(22) Filed: May 10, 2022

(65) Prior Publication Data
US 2022/0375912 A1 Nov. 24, 2022

(30) Foreign Application Priority Data

May 18, 2021 (FR) ...................................... 2105160
Oct. 28, 2021 (FR) ...................................... 2111479

(51) Int. Cl.
| H01L 25/16 | (2023.01) |
| H01L 25/075 | (2006.01) |
| H10F 55/15 | (2025.01) |
| H10H 20/01 | (2025.01) |
| H10H 20/824 | (2025.01) |

(Continued)

(52) U.S. Cl.
CPC ........ *H01L 25/167* (2013.01); *H01L 25/0756* (2013.01); *H10H 20/013* (2025.01); *H10H 20/824* (2025.01); *H10H 20/8512* (2025.01); *H10H 20/857* (2025.01); *H10H 20/0361* (2025.01); *H10H 20/0364* (2025.01)

(58) Field of Classification Search
CPC . H01L 25/167; H01L 25/0753; H10H 20/857; H10H 20/01; H10F 55/15
See application file for complete search history.

(56) References Cited

U.S. PATENT DOCUMENTS

2010/0276776 A1* 11/2010 Lee ....................... H10F 39/811
438/66
2017/0155020 A1 6/2017 Lin et al.
(Continued)

FOREIGN PATENT DOCUMENTS

EP 3 667 728 A1 6/2020

OTHER PUBLICATIONS

Preliminary Search Report for French Application No. 2105160, dated Dec. 8, 2021.
(Continued)

*Primary Examiner* — Mohsen Ahmadi
(74) *Attorney, Agent, or Firm* — Wolf, Greenfield & Sacks, P.C.

(57) ABSTRACT

A method of manufacturing an optoelectronic device, including the steps of: a) arranging an active photosensitive diode stack on a first substrate; b) transferring the active photosensitive diode stack onto an integrated control circuit previously formed inside and on top of a second semiconductor substrate, and then removing the first substrate; c) arranging an active light-emitting diode stack on a third substrate; and d) after steps b) and c), transferring the active light-emitting diode stack onto the active photosensitive diode stack, and then removing the third substrate.

18 Claims, 7 Drawing Sheets

(51) Int. Cl.
    *H10H 20/833*     (2025.01)
    *H10H 20/851*     (2025.01)
    *H10H 20/857*     (2025.01)
    *H10H 29/14*     (2025.01)

(56) References Cited

U.S. PATENT DOCUMENTS

2017/0186908 A1*   6/2017   Robin .................... H01L 25/167
2018/0366450 A1*  12/2018   Gardner ............... H10H 20/857
2021/0125971 A1*   4/2021   Chu ........................ H01L 24/97
2021/0134654 A1    5/2021   Or-Bach et al.

OTHER PUBLICATIONS

Liu et al. Recent progress of heterogeneous integration for semiconductor materials and microsystems. 8th IEEE International Conference on Solid-State and Integrated Circuit Technology Proceedings (ICSICT). Oct. 23, 2006:520-3.

Liu et al., High-bandwidth InGaN self-powered detector arrays toward MIMO visible light communication based on micro-LED arrays. ACS Photonics. Oct. 31, 2019;6(12):3186-95.

* cited by examiner

OPTOELECTRONIC DEVICE MANUFACTURING METHOD

CROSS-REFERENCE TO RELATED APPLICATIONS

This application claims priority to French application number 2111479, filed Oct. 28, 2021 and French application number 2105160, filed May 18, 2021, the contents of which are incorporated by reference in its entirety.

TECHNICAL BACKGROUND

The present disclosure generally concerns the field of optoelectronic devices, and more particularly aims at a method of manufacturing an optoelectronic device combining a light emission function and an optical capture function.

PRIOR ART

Various applications are likely to benefit from an optoelectronic device combining a light emission function and an optical capture function. Such a device may for example be used to form an interactive display screen.

SUMMARY OF THE INVENTION

An object of an embodiment is to overcome all or part of the disadvantages of known solutions for forming an optoelectronic device combining a light emission function and an optical capture function.

An embodiment provides an optoelectronic device manufacturing method, comprising the steps of:
- a) arranging an active photosensitive diode stack on a first substrate;
- b) transferring the active photosensitive diode stack onto an integrated control circuit previously formed inside and on top of a second semiconductor substrate, and then removing the first substrate;
- c) arranging an active light-emitting diode stack on a third substrate; and
- d) after steps b) and c), transferring the active light-emitting diode stack onto the active photosensitive diode stack, and then removing the third substrate.

According to an embodiment, the active photosensitive diode stack comprises at least one inorganic semiconductor layer, for example, made of a III-V material, and the active light-emitting diode stack comprises at least one inorganic semiconductor layer, for example, made of a III-V material.

According to an embodiment, the active photosensitive diode stack comprises first, second, and third semiconductor layers, the second layer being arranged between the first and third layers.

According to an embodiment, the method comprises a step of P-type doping of local portions of the first layer, said portions defining anode regions of photosensitive diodes of the device.

According to an embodiment, the step of P-type doping of the local portions of the first layer is implemented after step b) and before step d).

According to an embodiment, the step of P-type doping of the local portions of the first layer is implemented before step b).

According to an embodiment, the method further comprises a step of forming of connection metallizations on top of and in contact with said local portions of the first layer.

According to an embodiment, at the end of step b), the active photosensitive diode stack continuously extends over the entire surface of the integrated control circuit.

According to an embodiment, at the end of step d), the active light-emitting diode stack continuously extends over the entire surface of the integrated control circuit.

According to an embodiment, the method further comprises, after step b) and before step d), a step of forming of conductive vias crossing the active photosensitive diode stack.

According to an embodiment, the conductive vias are electrically connected to metal connection pads of the integrated circuit.

According to an embodiment, the method further comprises, after step d), a step of local etching of the active light-emitting diode stack to form in the active light-emitting diode stack a plurality of tiles, each defining a light-emitting diode.

According to an embodiment, the method comprises the forming of color conversion elements above at least some of the light-emitting diodes.

According to an embodiment, at least one of the light-emitting diodes is topped with a photoluminescent conversion element adapted to converting the light emitted by the light-emitting diode into a visible wavelength and at least another one of the light-emitting diodes is topped with a photoluminescent conversion element adapted to converting the light emitted by the light-emitting diode into a light radiation in the wavelength range of sensitivity of the active photosensitive diode stack, preferably an infrared radiation.

According to an embodiment, at least one of the light-emitting diodes is not topped with a photoluminescent conversion element.

According to an embodiment, the photoluminescent conversion elements are formed based on quantum dots or on perovskite materials.

According to an embodiment, the method comprises, after step d), a step of bonding of a temporary support substrate on the side of the active light-emitting diode stack opposite to the integrated circuit, followed by a step of cutting of the assembly comprising the integrated circuit, the active photosensitive diode stack, and the active light-emitting diode stack into a plurality of elementary chips.

According to an embodiment, the method further comprises a step of transfer and of bonding of the elementary chips onto a transfer substrate of the device, followed by a step of removal of the temporary support substrate.

Another embodiment provides an optoelectronic device comprising a transfer substrate and a plurality of elementary chips bonded and electrically connected to the transfer substrate, each elementary chip comprising a stack comprising, in the order from the upper surface of the transfer substrate, an integrated control circuit formed inside and on top of a semiconductor substrate, a photodetection stage comprising at least one photosensitive diode, and an emission stage comprising at least one light-emitting diode.

According to an embodiment, in each elementary chip, the photodetection stage is arranged between the integrated control circuit and the emission stage, and the photosensitive diode has a semiconductor anode layer arranged on the side of the emission stage and a semiconductor cathode layer arranged on the side of the integrated control circuit.

Another embodiment provides a system comprising an optoelectronic device formed by a method such as defined hereabove, and a light source adapted to emitting a light radiation in the wavelength range of sensitivity of the active photosensitive diode stack, preferably an infrared radiation.

According to an embodiment, the light source is a remote source.

According to an embodiment, the light source is integrated to the optoelectronic device and comprises at least one light-emitting diode formed in the active light-emitting diode stack.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the photosensitive diodes, of the light-emitting diodes (LED), and of the integrated control circuits of the described devices has not been detailed, the detailed implementation of these elements being within the abilities of those skilled in the art based on the functional indications of the present description. Further, the various applications that the described embodiments may have have not been detailed, the described embodiments being compatible with all or most of the applications likely to benefit from a device combining a light emission function and an optical capture function (photodetection).

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred unless specified otherwise to the orientation of the drawings.

Unless specified otherwise, the expressions "around", "approximately", "substantially" and "in the order of" signify within 10%, and preferably within 5%.

According to an aspect of an embodiment, it is provided, to form an optoelectronic device combining a light emission function and a photodetection function, to implement the following steps:

a) arranging an active photosensitive diode stack on a first substrate;

b) transferring the active photosensitive diode stack onto an integrated control circuit previously formed inside and on top of a second semiconductor substrate, and then removing the first substrate;

c) arranging an active LED stack on a third substrate; and d) after steps b) and c), transferring the active LED stack onto the active photosensitive diode stack, and then removing the third substrate.

FIGS. 1A to 1J are cross-section views illustrating successive steps of a non-limiting example of implementation of such a method. Different variants are within the abilities of those skilled in the art based on the indications of the present description.

Figure 1A:
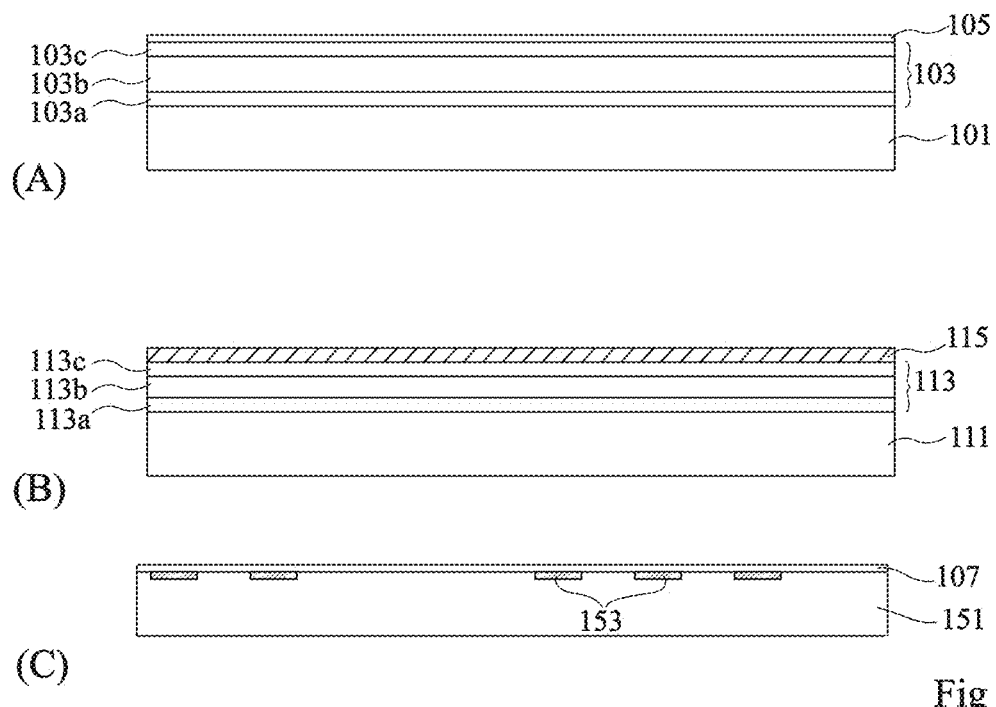
FIGS. 1A, 1B, 1C, 1D, 1E, 1F, 1G, 1H, 1I, and 1J are cross-section views illustrating successive steps of an embodiment of an optoelectronic device manufacturing method according to an embodiment.

FIG. 1A schematically illustrates, in its upper portion (A), the structure obtained at the end of steps of forming of an active photosensitive diode stack 103 on the upper surface of a substrate 101.

Stack 103 preferably is a stack of inorganic semiconductor layers. Stack 103 for example comprises one or a plurality of layers made of a III-V-type semiconductor material. Stack 103 is for example an active photodiode stack sensitive in infrared or near infrared. As a variant, stack 103 is an active photodiode stack sensitive in the visible range. As an example, stack 103 comprises, in the order from the upper surface of substrate 101, a layer 103a of non-intentionally doped indium phosphide (InP), an absorption layer 103b of indium-gallium arsenide (InGaAs), for example, intrinsic or lightly N-type doped (for example, in the order of $10^{15}$ atoms/cm$^3$), and a layer 103c of N-type doped indium phosphide (InP). As an example, the N-type doping level of layer 103c is in the range from $10^{16}$ to $10^{18}$ atoms/cm$^3$. In this example, layer 103b is in contact, by its lower surface, with the upper surface of layer 103a, and layer 103c is in contact, by its lower surface, with the upper surface of layer 103b.

Substrate 101 is for example made of indium phosphide. Layers 103a, 103b, and 103c may be successively formed by epitaxy on the upper surface of substrate 101. Substrate 101 then is a growth substrate. A buffer layer, not shown, for example, made of indium phosphide, may possibly form an interface between substrate 101 and layer 103a. Buffer layer is for example in contact, by its lower surface, with the upper surface of substrate 101, and by its upper surface, with the lower surface of layer 103a. The buffer layer may also be formed by epitaxy from the upper surface of substrate 101, before the forming of layers 103a, 103b, and 103c.

As a variant, rather than forming active photosensitive diode stack 103 by epitaxy on the upper surface of substrate 101, the active stack may be formed in the inverse order on a growth substrate, not shown, and then transferred and bonded onto substrate 101. In this case, layers 103c, 103b, and 103a are successively formed by epitaxy on a surface of the growth substrate. A buffer layer, for example, of indium phosphide, may possibly form an interface between the growth substrate and layer 103c. Stack 103 is then bonded to the upper surface of substrate 101, for example, by direct bonding or molecular bonding of the lower surface of layer 103a to the upper surface of substrate 101. As a variant, other bonding methods may be used. The growth substrate and, possibly, the buffer layer forming an interface between the growth substrate and layer 103c, are then removed to clear the access to the upper surface of layer 103c. In this variant, substrate 101 is a support substrate, for example, made of silicon, or of any other material adapted to being used as a support for receiving active stack 103.

FIG. 1A further illustrates, in its upper portion (A), a step of deposition of a dielectric layer 105, for example, made of silicon oxide or of silicon nitride, on top of and in contact with the upper surface of the upper layer 103c of active photosensitive diode stack 103. In this example, dielectric layer 105 extends continuously and with a substantially uniform thickness over the entire upper surface of layer 103c.

FIG. 1A further schematically illustrates, in its intermediate portion (B), the structure obtained at the end of steps of forming of an active LED stack 113 on the upper surface of a substrate 111.

Stack 113 preferably is a stack of inorganic semiconductor layers. Stack 113 for example comprises one or a plurality of layers made of a III-V-type semiconductor material. Stack 113 is for example an active LED stack adapted to emitting visible light, for example, mainly blue light. As an example, stack 113 is an active gallium nitride (GaN) LED stack. As an example, stack 113 comprises, in the order from the upper surface of substrate 111, an N-type doped semiconductor layer 113a, forming a cathode layer of the LED stack, an active layer 113b, and a P-type doped semiconductor layer 113c, forming an anode layer of the LED stack. Layer 113a is for example made of gallium nitride. Active layer 113b is for example a multiple quantum well stack (not detailed in the drawing), formed of an alternation of semiconductor layers of a first material, for example, a III-V-type material, and of semiconductor layers of a second material, for example, a III-V-type material, each layer of the first material being sandwiched between two layers of the second material and defining a quantum well. Layer 113c is for example made of gallium nitride. Active layer 113b is for example in contact, by its lower surface, with the upper surface of layer 113a. Layer 113c is for example in contact, by its lower surface, with the upper surface of active layer 113b.

Substrate 111 is for example made of silicon, of sapphire, or of gallium nitride. As an example, layers 113a, 113b, and 113c are successively formed by epitaxy on the upper surface of substrate 111. A buffer layer, not shown, may possibly form an interface between the upper surface of substrate 111 and the lower surface of layer 113a.

At this stage, each of the layers of active photosensitive diode stack 103 extends, for example, continuously and with a substantially uniform thickness over the entire upper surface of substrate 101. Further, each of the layers of active LED stack 113 for example extends substantially continuously and with a substantially uniform thickness over the entire upper surface of substrate 111. Substrates 101 and 111 for example have substantially the same lateral dimensions.

FIG. 1A further illustrates, in its intermediate portion (B), a step of deposition of a conductive layer 115 on top of and in contact with the upper surface of semiconductor layer 113c. Layer 115 forms an ohmic contact with the semiconductor material of layer 113c. Layer 115 is for example made of aluminum, of nickel, or also of a transparent conductive oxide, for example, of indium-tin oxide (ITO). At this stage, metal layer 115 extends continuously and with a substantially uniform thickness over the entire upper surface of layer 113c. Layer 115 may further have an optical reflector function. As an example, layer 115 may comprise two stacked layers respectively ensuring the function of ohmic contact with the semiconductor material of layer 113c and the optical reflector function.

FIG. 1A further schematically illustrates, in its lower portion (C), an integrated control circuit 151 previously formed inside and on top of a semiconductor substrate, for example, made of silicon. Integrated control circuit 151 comprises circuits for controlling and reading the LEDs and the photosensitive diodes of the device. As an example, integrated circuit 151 comprises an assembly of elementary control and readout cells, enabling to individually control and read each LED and each photosensitive diode of the device. Integrated circuit 151 is for example a CMOS ("Complementary Metal Oxide Semiconductor") circuit. In this example, circuit 151 comprises a plurality of metal connection pads 153 arranged on its upper surface side.

FIG. 1A further illustrates, in its upper portion (C), a step of deposition of a dielectric layer 107, for example, made of silicon oxide or of silicon nitride, for example, made of the same material as layer 105, on top of and in contact with the upper surface of integrated control circuit 151. In this example, dielectric layer 107 extends continuously and with a substantially uniform thickness over the entire upper surface of integrated control circuit 151.

Figure 1B:
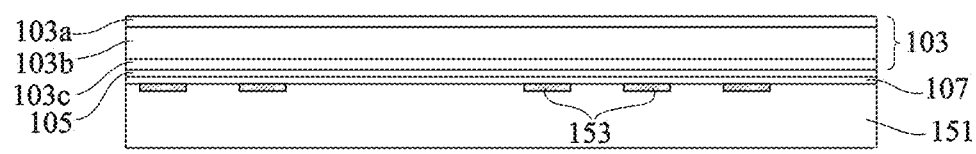

FIG. 1B illustrates the structure obtained at the end of a step of transfer and of bonding of active photosensitive diode stack 103 onto integrated control circuit 151, and then of removal of substrate 101. During this step, active photosensitive diode stack 103 is transferred onto integrated circuit 151, by using substrate 101 as a support handle. In FIG. 1B, the structure comprising substrate 101 and stack 103 is flipped with respect to the orientation of FIG. 1A. Stack 103 is then bonded to integrated circuit 151. In this example, stack 103 is bonded by direct bonding or molecular bonding of the lower surface (in the orientation of FIG. 1B, corresponding to the upper surface in the orientation of FIG. 1A) of layer 105 onto the upper surface (in the orientation of FIG. 1B, corresponding to the upper surface in the orientation of FIG. 1A) of layer 107. As a variant, other bonding methods may be used. Substrate 101 is then removed, for example, by grinding and/or chemical etching, to clear the access to the upper surface of layer 103a. At this stage, each of the layers of active photosensitive diode stack 103 extends for example continuously and with a substantially uniform thickness over the entire surface of integrated control circuit 151. It should be noted that, in this example, active stack 103 is non-structured and has been submitted to no step of local treatment before the transfer step. Thus, the transfer step requires no specific alignment.

Figure 1C:
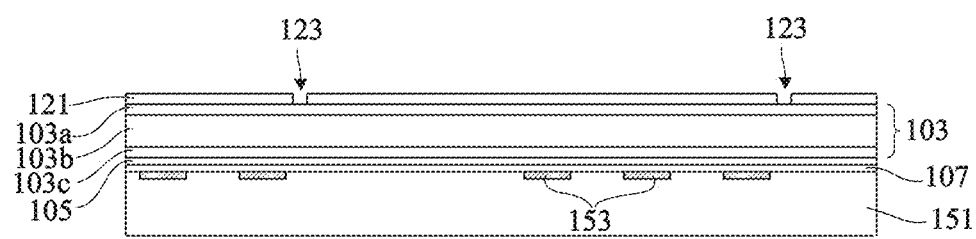

FIG. 1C illustrates a step of deposition of a dielectric layer 121, for example, made of silicon nitride or of silicon oxide, on the upper surface of layer 103a, for example, in contact with the upper surface of layer 103a. Layer 121 is for example deposited by a plasma-enhanced chemical vapor deposition (PECVD) method. Layer 121 is for example continuously deposited with a uniform thickness over the entire upper surface of layer 103a. FIG. 1C further illustrates a step of forming of local through openings 123 in dielectric layer 121. Openings 123 are for example formed by photolithography and etching. The openings are arranged opposite future P-type contacting areas corresponding to anode regions of the photosensitive diodes of the device.

Figure 1D:
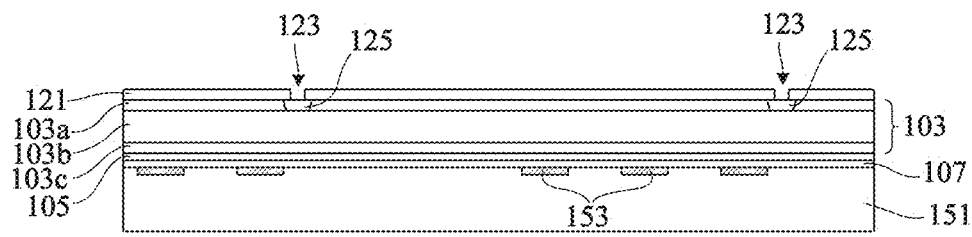

FIG. 1D illustrates a step of P-type doping of local regions 125 of layer 103a, located opposite openings 123. The doping of regions 125 may be performed by diffusion or implantation of P-type dopant elements, for example, zinc (Zn) or beryllium (Be), opposite openings 123. An anneal of activation of the dopant elements may then be implemented. As an example, the activation anneal may be a surface laser anneal, which enables not to damage integrated circuit components 151, nor to alter the quality of the bonding between integrated circuit 151 and active photosensitive diode stack 103. P-type doped regions 125 form anode regions of the photosensitive diodes of the device. In this example, regions 125 extend across the entire thickness of layer 103a, and come into contact, by their lower surface, with the upper surface of absorption layer 103b.

Figure 1E:
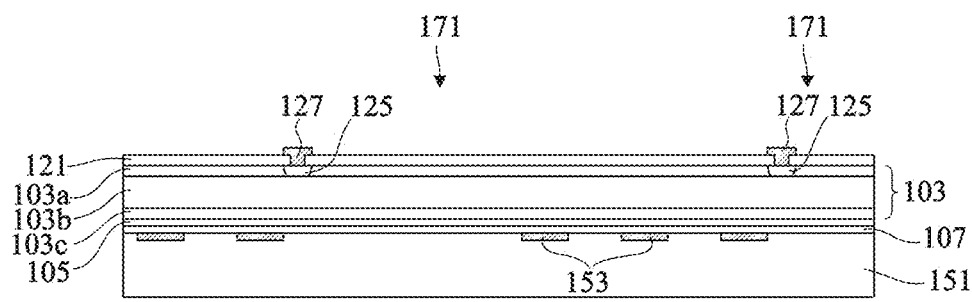

FIG. 1E illustrates a step of forming of contacting metallizations 127 in openings 123. Each metallization 127 individually contacts the underlying region 125, through the corresponding opening 123. As an example, a metal layer is first continuously deposited over the entire upper surface of the structure, that is, on top of and in contact with the upper surface of dielectric layer 121 and in openings 123, and then removed by photolithography and etching to only keep metallizations 127. In this example, each metallization 127 forms an anode electrode of a photosensitive diode 171 of the device.

Figure 1F:
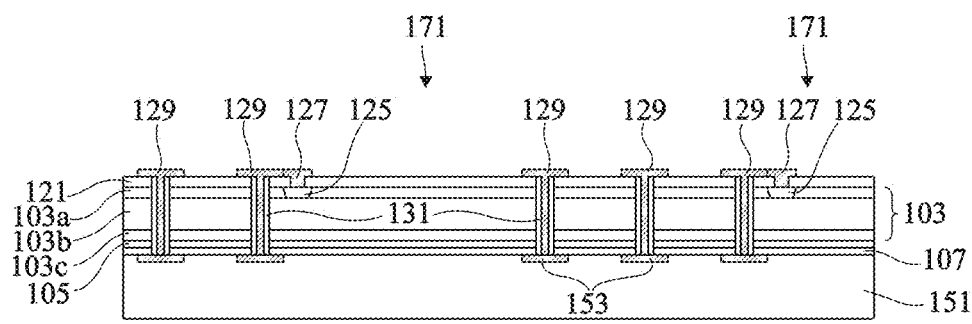

FIG. 1F illustrates the structure obtained at the end of steps of forming of laterally-insulated conductive vias 129, crossing active photosensitive diode stack 103. More particularly, in this example, conductive vias 129 cross layer 121, layers 103a, 103b, and 103c of stack 103, insulating layers 105 and 107, and each emerge onto and in contact with the upper surface of a metal pad 153 of the integrated control circuit. The forming of vias 129 comprises a step of etching, from the upper surface of insulating layer 121, of through openings in the stack formed by layers 107, 105, 103c, 103b, 103a, and 121. The openings are for example formed by plasma etching, for example of ICP (Inductively Coupled Plasma) type. A step of passivation of the sides of the openings is then implemented. During this step, a layer 131 of an insulating material, for example, silicon oxide, is deposited on the lateral walls and at the bottom of the openings. A step of vertical anisotropic etching may then be implemented to remove the insulating layer from the bottom of the openings, without removing it from the lateral walls. The openings are then filled with metal to form conductive vias 129.

Before or after the forming of conductive vias 129, one or a plurality of contacting conductive vias (not shown in the drawings) on the cathode layer 103c of the photosensitive diode stack may be formed. These cathode contacting vias are similar to the vias 129 shown in FIG. 1F, that is, they cross layer 121, the layers 103a, 103b, and 103c of stack 103, insulating layers 105 and 107, and emerge onto and in contact with the upper surface of a metal pad 153. The cathode contacting vias differ from vias 129 in that they are in contact, laterally, with the sides of the semiconductor cathode layer 103c of the photosensitive diode stack. The cathode contacting vias are however laterally insulated from anode semiconductor layer 103a by a lateral insulation layer. To form the lateral insulation layer which coats the sides of anode semiconductor layer 103a and does not coat the sides of cathode semiconductor layer 103a, a possibility is to deposit the insulating passivation material by sputtering, with angle of incidence, so that the insulating material only deposits on an upper portion of the walls of the opening of the via. The deposition depth may be adjusted by varying the applied inclination angle. As a variant, the cathode contacting vias may be formed in two successive etch steps. During a first etch step, a first opening crossing anode semiconductor layer 103a and all or part of absorption layer 103b is formed. An insulating passivation layer is then deposited on the lateral walls of the first opening. During a second etch step, a second opening crossing cathode semiconductor layer 103c is formed, the second opening having lateral dimensions smaller than those of the first opening. The first and second openings are then filled with metal.

Figure 1G:
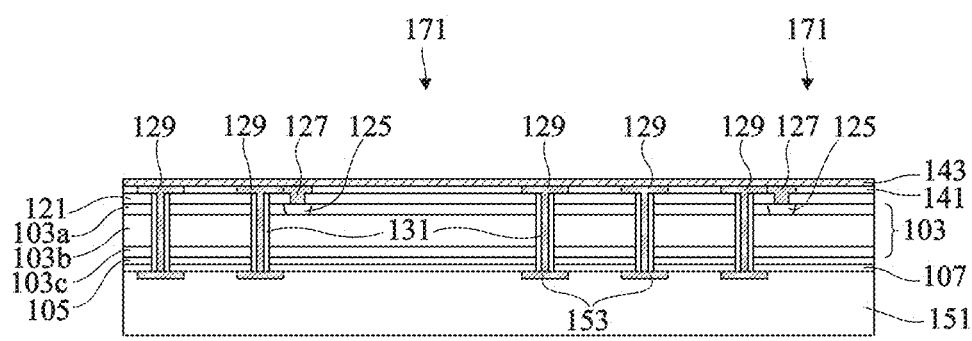

FIG. 1G illustrates the structure obtained at the end of a step of deposition of a metal layer 143 on the upper surface of the structure of FIG. 1F. In this example, metal layer 143 extends continuously with a substantially uniform thickness over the entire upper surface of the structure of FIG. 1F. In the shown example, prior to the deposition of metal layer 143, a step of planarization of the upper surface of the structure is implemented, for example, by a damascene-type method. For this purpose, an insulating layer 141, for example, made of silicon oxide, is deposited over the entire upper surface of the structure of FIG. 1F, across a thickness greater than the thickness of the portions of metallizations 127 and 129 protruding from the upper surface of insulating layer 121. Insulating layer 141 is then planarized from its upper surface, for example, by chemical-mechanical polishing, to clear the access to the upper surface of metallizations 127 and 129. A planar upper surface exhibiting an alternation of insulating and metal regions is thus obtained. Metal layer 143 is then deposition on top of and in contact with this planarized surface. Metal layer 143 is for example made of the same metal as the metal layer 115 deposited on the upper surface of LED stack 113 (FIG. 1A).

Figure 1H:
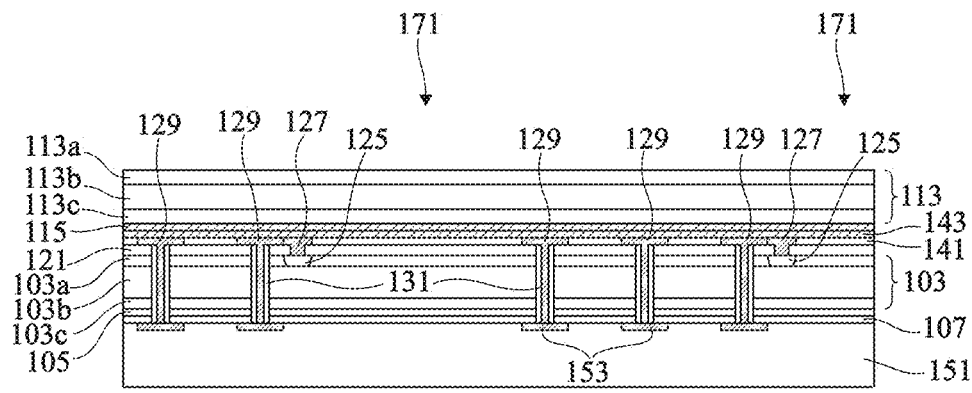

FIG. 1H illustrates the structure obtained at the end of a step of transfer and bonding of active LED stack 113 onto the upper surface of the structure of FIG. 1G, and then of removal of substrate 111. During this step, active LED stack 113 is transferred onto the upper surface of the structure of FIG. 1G, by using substrate 111 as a support handle. In FIG. 1H, the structure comprising substrate 111, stack 113, and layer 115 is turned upside down with respect to the orientation of FIG. 1A. Stack 113 is then bonded to the structure of FIG. 1G. As an example, stack 113 is bonded by direct bonding or molecular bonding of the lower surface (in the orientation of FIG. 1H, corresponding to the upper surface in the orientation of FIG. 1A) of layer 115 onto the upper surface (in the orientation of FIG. 1H, corresponding to the upper surface in the orientation of FIG. 1G), of the upper metal layer 143 of the structure of FIG. 1G. Preferably, the bonding is a bonding of SAB ("Surface Activated Bonding") type, that is, a direct bonding where the surfaces placed into contact are previously activated by atom bombarding. The SAB bonding has the advantage of being capable of being implemented at low temperature, for example, at room temperature. Substrate 111 is then removed, for example, by grinding and/or chemical etching, or by a laser separation method, to clear the access to the upper surface of layer 113a. At this stage, each of the layers of active LED stack 113 for example extends continuously and with a substantially uniform thickness, over the entire surface of the active stack of the assembly. It should be noted that in this example, active LED stack 113 is non-structured and has been submitted to no local treatment step before the transfer step. Thus, the transfer step requires no specific alignment.

Figure 1I:
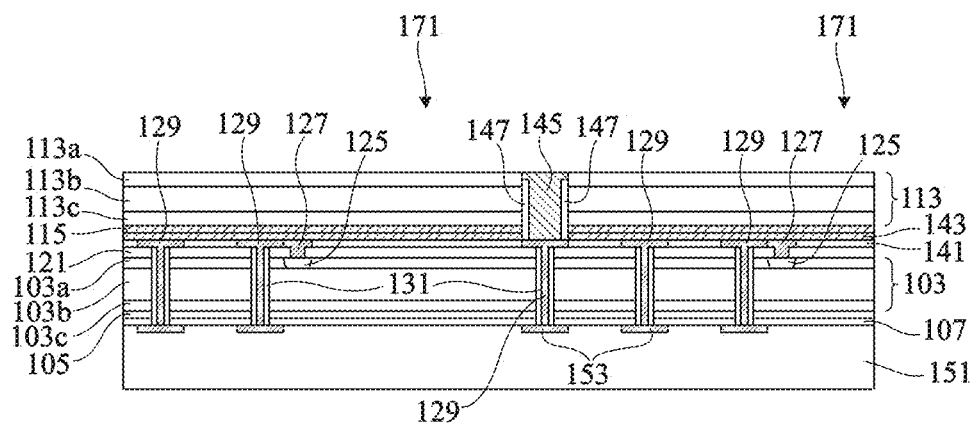

FIG. 1I illustrates the structure obtained at the end of a step of forming of cathode contact metallizations 145 of the LEDs of the device in openings crossing active LED stack 113 and metal layers 115 and 143. Each cathode contact metallization 145 extends vertically from the upper surface of the stack all the way to the upper surface of a conductive via 129 of the device. Thus, each cathode contact metallization 145 is electrically connected, via the underlying conductive via 129, to a dedicated metal connection pad 153 of integrated control circuit 151.

A step of local etching of layers 113a, 113b, 113c, 115, and 143 is first implemented to form the openings intended to receive metallizations 145. A step of passivation of the opening sides is then implemented. During this step, a layer 147 of an insulating material, for example, silicon oxide, is deposited on the lateral walls and at the bottom of the openings. A step of vertical anisotropic etching may then be implemented to remove insulating layer 147 from the bottom of the openings. Insulating layer 147 may further be removed, inside of the openings, from the sides of an upper portion of the cathode layer 113a of LED stack 113. Insulating layer 147 is however kept, inside of the openings, on the sides of layers 113b, 113c, 115, and 143. The openings are then filled with metal to form metallizations 145. Thus, each metallization 145 is in contact with the N-type layer 113a of the active LED stack at the level of the lateral walls of the opening. Each metallization 145 is however laterally insulated from layers 113b, 113c, 115, and 143 by insulating layer 147.

Figure 1J:
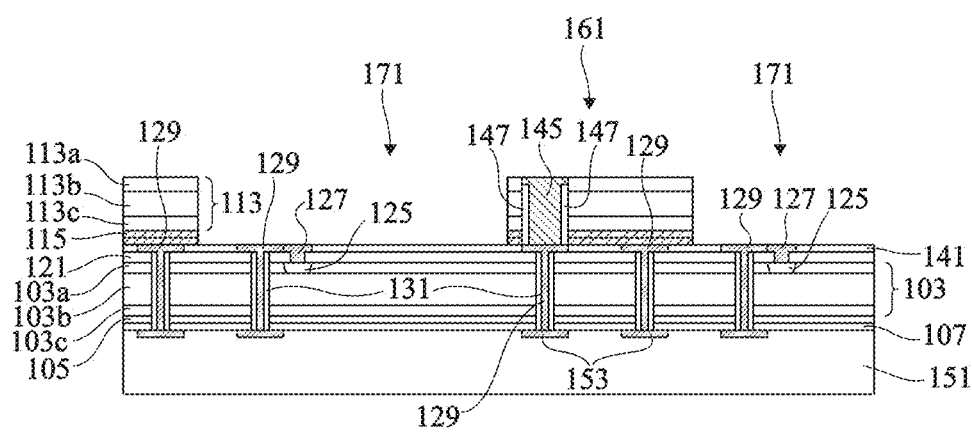

FIG. 1J illustrates the structure obtained at the end of a step of local etching of the stack formed by metal layers 143 and 115 and active LED stack 113. During this step, only are kept tiles 161 of active LED stack 113, respectively corresponding to the different LEDs 161 of the device. In this example, each LED tile 161 comprises a cathode contact metallization 145. The portion of the stack of metal layers 115 and 143 located under each LED 161 forms an anode electrode of the LED and is electrically connected to a dedicated pad 153 of integrated circuit 151 via a via 129.

Outside of LED tiles 161, stack 113 and metal layers 115 and 143 are entirely removed, to expose the upper surface of dielectric layer 141 and of the underlying metallizations 129 and 127. In particular, in this example, stack 113 and layers 115 and 143 are removed opposite the photosensitive diodes 171 of the device.

A subsequent step of passivation of the sides of LEDs 161, not detailed, may optionally be provided.

It should be noted that in the shown example, the anode electrodes 127 of photosensitive diodes 171 and the anode electrodes 115, 143 and the cathode electrodes 145 of LEDs 161 are all individually connected to connection pads 153 of integrated circuit 151. The cathode electrode(s) of photosensitive diodes 171 may be common to all the photosensitive diodes 171 of the device, and connected to integrated circuit 151 at the periphery of the device, via cathode contacting vias of the above-described type.

As a variant, the cathode electrodes of LEDs 161 may be common to all the LEDs 161 of the device, and connected to integrated circuit 151 at the periphery of the device, to limit the number of conductive vias 129 and of pads 153. In another variant, not shown, the cathode electrodes of LEDs 161 and of photosensitive diodes 171 may be common.

According to the envisaged application, light conversion elements, not shown, may possibly be arranged opposite LEDs 161, on their upper surface sides, to obtain, on a same device, emission pixels adapted to emitting in different wavelength ranges, for example, red pixels, green pixels, and blue pixels. Further, filtering elements, not shown, may be possibly arranged opposite photosensitive diodes 171, on their upper surface sides, to obtain, on a same device, detection pixels adapted to detecting radiations in different wavelength ranges.

The method described in relation with FIGS. 1A to 1J may be used to form monolithic microdisplays, combining an image display function and an optical capture function, for example, to form an interactive display screen adapted to implementing functions of face or shape recognition, of motion detection, of identification, etc. An advantage of the described method is that it enables to form display pixels and capture pixels of small lateral dimensions, and thus obtain high display resolutions and capture resolutions. It should be noted that in the above-described example, each pixel of the device comprises a photosensitive diode 171 and a LED 161. As a variant, the resolution of the display device and the resolution of the optical sensor may be different. For example, the number of photosensitive diodes 171 of the device may be smaller than the number of LEDs 161.

As a variant, the method described in relation with FIGS. 1A to 1J may be used to form interactive display devices of larger dimensions, for example, a screen for a television, computer, smartphone, digital tablet, etc. Such a device may comprise a plurality of elementary electronic chips arranged, for example, according to an array layout, on a same transfer substrate. The elementary chips are rigidly assembled to the transfer substrate and connected to electric connection elements of the transfer substrate for their control. Each chip comprises one or a plurality of LEDs 161, one or a plurality of photosensitive diodes 171, and a circuit 151 for controlling said one or a plurality of LEDs and said one or a plurality of photosensitive diodes. Each chip for example corresponds to a pixel of the device. As an example, each chip comprises three individually-controllable LEDs 161 respectively defining three sub-pixels adapted to respectively emitting red light, green light, and blue light, and a photosensitive diode 171 adapted to detecting an infrared or near-infrared radiation.

FIGS. 2A to 2G are cross-section views illustrating successive steps of an example of a method of manufacturing such a device.

Figure 2A:
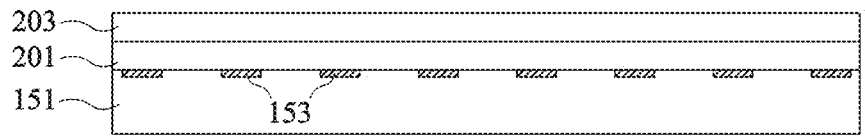
FIGS. 2A, 2B, 2C, 2D, 2E, 2F, and 2G are cross-section views illustrating other successive steps of an example of a method of manufacturing an optoelectronic device according to an embodiment.

FIG. 2A very schematically illustrates an initial structure which corresponds to a structure of the type obtained by the method of FIGS. 1A to 1J, comprising an integrated control circuit stage 151 topped with a photodetection stage 201, itself topped with an emission stage 203. Photodetection stage 201 comprises a plurality of photosensitive diodes 171 (not detailed in FIGS. 2A to 2G) individually controllable by integrated circuit 151. The emission stage comprises a plurality of LEDs 161 (not detailed in FIGS. 2A to 2G) individually controlled by integrated circuit 151. In FIG. 2A, only the electric connection pads 153 of integrated circuit 151, arranged on the upper surface side of integrated circuit 151, have been detailed.

Figure 2B:
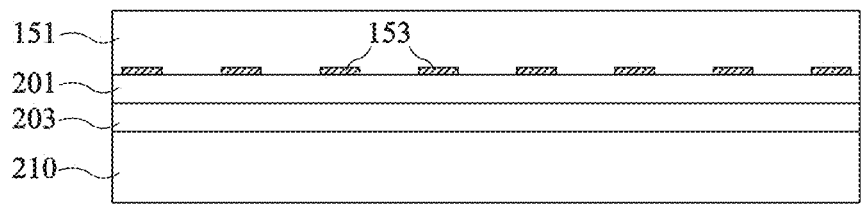

FIG. 2B illustrates a step of bonding of the structure of FIG. 2A onto a temporary support substrate 210, for example, made of silicon. The structure of FIG. 2A is bonded to support substrate 210 by its surface opposite to integrated control circuit 151, that is, by its lower surface in the orientation of FIG. 2B, corresponding to its upper surface in the orientation of FIG. 2A.

Figure 2C:
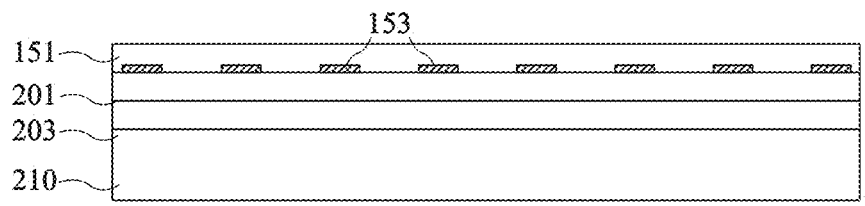

FIG. 2C illustrates an optional step of thinning of the semiconductor substrate of integrated circuit 151, from its surface opposite to stages 201 and 203. As an example, integrated circuit 151 is initially formed inside and on top of a substrate of SOI ("Semiconductor On Insulator") type. The SOI substrate for example comprises a silicon support, coated with an insulating layer, itself coated with a single-crystal silicon layer (not detailed in the drawings). The components, particularly transistors, of integrated circuit 151, may be formed inside and on top of the single-crystal silicon layer of the SOI substrate. The thinning step of FIG. 2C may comprise removing the support substrate of the SOI substrate, to only keep the single-crystal silicon layer and the insulating layer of the SOI substrate.

As a variant, integrated circuit 151 is formed inside and on top of a solid silicon substrate, and the thinning step may then comprise decreasing the substrate thickness, for example, by grinding, from its upper substrate (in the orientation of FIG. 2C). An insulating passivation layer (not detailed in the drawing) may then be deposited on the upper surface of the thinned substrate.

Figure 2D:
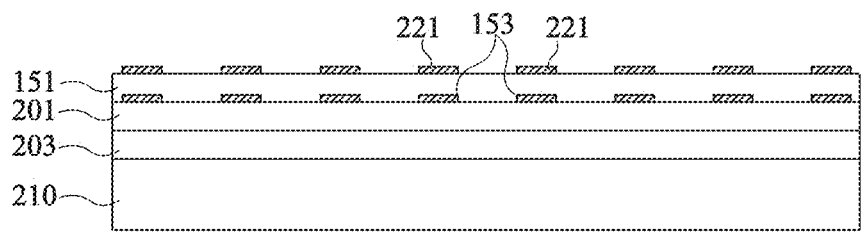

FIG. 2D illustrates a step of forming, on the upper surface side of integrated circuit 151, of metal connection pads 221 coupled to connection pads 153 and/or to connection terminals of electronic components, for example, MOS transistors, of integrated circuit 151, via conductive vias not detailed in the drawing, crossing the semiconductor substrate of integrated circuit 151.

Figure 2E:
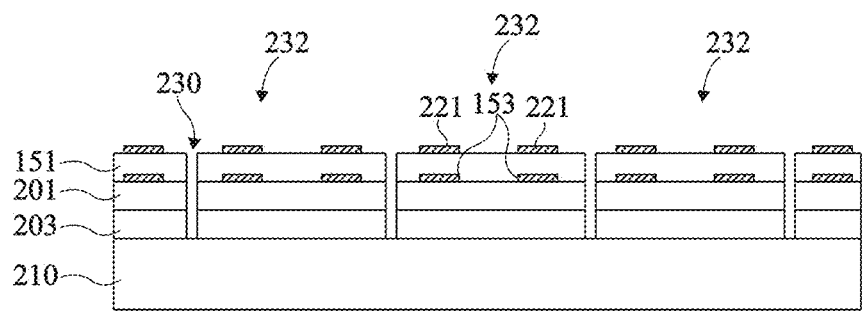

FIG. 2E illustrates a step of forming, from the upper surface of integrated circuit 151, of trenches 230 vertically crossing integrated circuit 151, detection stage 201, and emission stage 203, and emerging onto the upper surface of temporary support substrate 210. Trenches 230 laterally delimit a plurality of semiconductor chips 232 corresponding to the elementary chips of the pixel of the display device. Trenches 230 may be formed by plasma etching, by sawing, or by any other adapted cutting method.

Figure 2F:
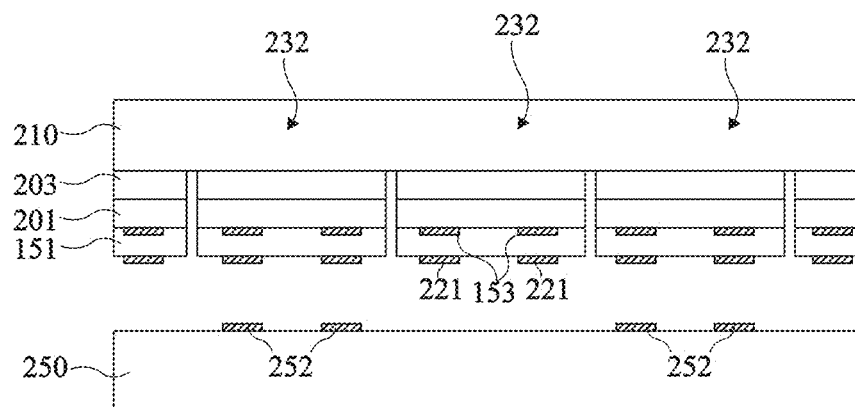
Figure 2G:
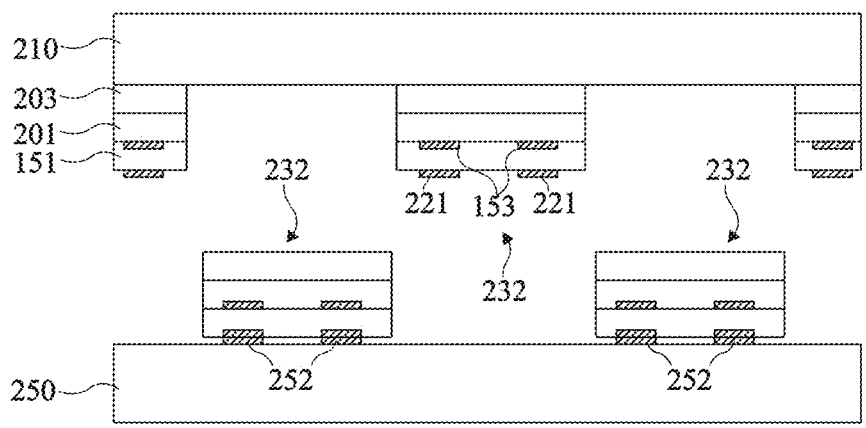

FIGS. 2F and 2G illustrate a step of bonding of elementary chips 232 onto the upper surface of a same transfer substrate 250 of the display device. Transfer substrate 250 comprises, on its upper surface side, a plurality of metal connection pads 252, intended to be bonded and electrically and mechanically connected to corresponding metal connection pads 221 of the elementary chips 232.

The structure of FIG. 2E is turned upside down (FIG. 2F) to place the metal connection pads 221 of elementary chips 232 opposite corresponding metal connection pads 252 of transfer substrate 250. Opposite pads 221 and 252 are then bonded and electrically connected, for example, by direct bonding, by welding, by means of microtubes, or by any other adapted method.

Once bonded to transfer substrate 250, elementary chips 232 are separated from temporary support substrate 210, and the latter is removed (FIG. 2G). As an example, the separation of the chips is performed by mechanical separation or by separation by means of laser beam.

In the shown example, the pitch (center-to-center distance in front view) of elementary chips 232 on transfer substrate 250 is a multiple of the pitch of elementary chips 232 on temporary support substrate 210. Thus, only part of elementary chips 232 (one out of two in the shown example) are simultaneously transferred from temporary support substrate 210 to transfer substrate 250. The other chips 232 remain attached to temporary transfer substrate 210 and may be subsequently onto another portion of transfer substrate 250 on onto another transfer substrate 250.

Various embodiments and variants have been described. Those skilled in the art will understand that certain features of these various embodiments and variants may be combined, and other variants will occur to those skilled in the art. In particular, the described embodiments are not limited to the examples of materials and/or of dimensions mentioned in the present disclosure.

Further, in the example described in relation with FIGS. 1A to 1J, the anode regions 125 and the anode metallizations 127 of photosensitive diodes 171 are formed after the transfer of active photosensitive diode stack 103 onto integrated circuit 151. As a variant, not detailed in the drawings, the anode regions 125 and the anode metallizations 127 of photosensitive diodes 171 may be formed before the transfer of active photosensitive diode stack 103 onto active LED stack 113. In this case, the order of the layers of stack 103 is inverted with respect to the example of FIG. 1A. The bonding of active photosensitive diode stack 103 onto integrated circuit 151 then is a hybrid bonding requiring an alignment of the anode metallizations 127 of the photosensitive diodes with respect to the metal connection pads 153 of integrated circuit 151. However, an advantage is that the anneal for activating the dopants of regions 125 can then be performed before the transfer of stack 103 onto integrated circuit 151, which avoids any degradation of integration circuit 151 or of the bonding between stack 103 and integrated circuit 151 during the anneal.

Figure 3:
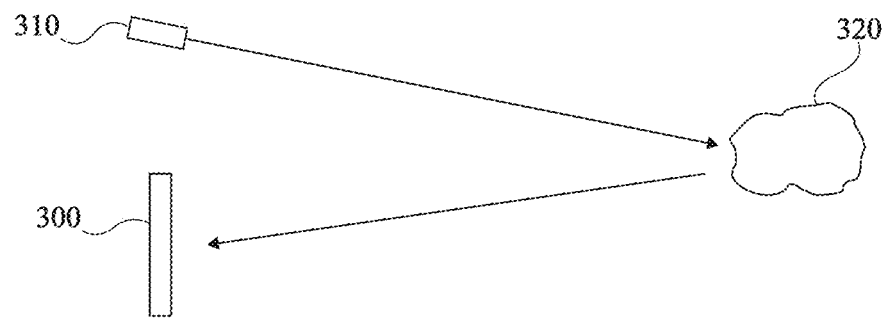
FIG. 3 schematically shows an example of a system comprising an optoelectronic device according to an embodiment.

FIG. 3 schematically shows an example of a system comprising an optoelectronic device 300 according to an embodiment.

Device 300 may be a device of monolithic microdisplay type, for example, formed by a method of the type described in relation with FIGS. 1A to 1J.

As a variant, device 300 may be a device of larger dimensions, for example formed by a method of the type described in relation with FIGS. 2A to 2G.

Device 300 combines an image display function and an optical capture function, for example, to form an interactive display screen adapted to implementing functions of face or shape recognition, of motion detection, of identification, etc.

The system of FIG. 3 further comprises a light source 310. Source 310 is adapted to emitting a light radiation in the sensitivity range of photosensitive diodes 171 (not detailed in FIG. 3) of device 300. As an example, source 310 is an infrared source, for example, a laser source.

In operation, source 310 illuminates a scene 320, an image of which is desired to be acquired. The light emitted by source 310 is reflected by scene 320 and returned to device 300. The photosensitive diodes 171 of device 300 then enable to acquire an image of scene 320 and/or to measure depth information relative to scene 320.

In the example of FIG. 3, light source 310 is a remote source, that is, it is distinct from device 300. The control of light source 310 and the control of the detection pixels of device 300 are for example synchronized.

Figure 4:
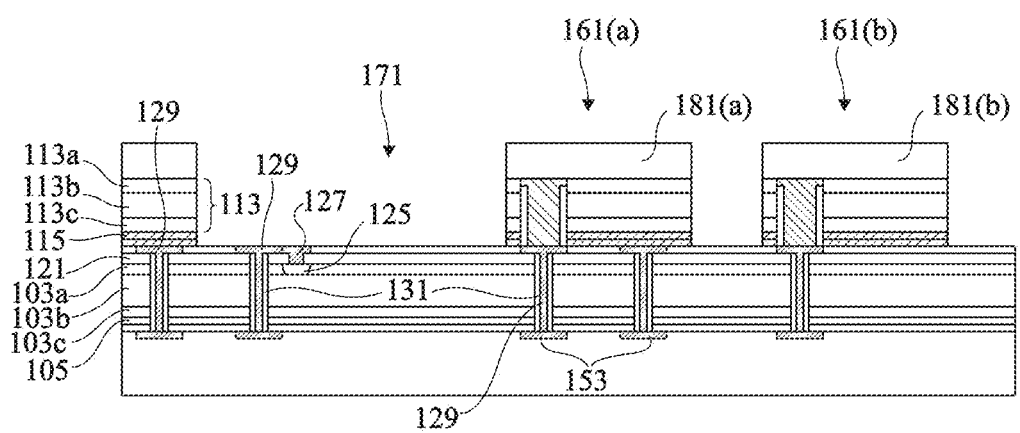
FIG. 4 is a cross-section view partially and schematically illustrating another example of an optoelectronic device according to an embodiment.

FIG. 4 is a cross-section view schematically and partially illustrating another example of an optoelectronic device according to an embodiment.

In this example, the optoelectronic device integrates a distributed light source emitting in the sensitivity range of photodiodes 171, for example, an infrared source. This enables to do away with the remote source 310 of the system of FIG. 3.

The device of FIG. 4 comprises elements common with the device of FIG. 1J. These elements will not be detailed again hereafter, and only the difference with respect to the device of FIG. 1J will be highlighted.

In the example of FIG. 4, two LEDs 161(a) and 161(b) of the device, for example, identical or similar, have been shown. LEDs 161(a) and 161(b) are adapted to emitting light in the same wavelength range, for example, mainly blue light. The described embodiments are however not limited to this specific example and it will be within the abilities of those skilled in the art to adapt the example of embodiment described in relation with FIG. 4 to other emission colors of LEDs 161.

In this example, LED 161(a) is coated, on its upper surface side, with a photoluminescent conversion element 181(a) adapted to converting the light emitted by the LED into visible light at another wavelength, for example, into red or green light in the case of a LED emitting blue light.

As an example, in the case of LEDs emitting blue light, three types of visible light emission pixels adapted to respectively emitting red light (by means of a photoluminescent conversion element converting the blue light emitted by the underlying LED into red light), green light (by means of a photoluminescent conversion element converting the blue light emitted by the underlying LED into green light), and blue light (with no conversion element), may be provided.

LED 161(*b*) is coated, on its upper surface side, with a photoluminescent conversion element 181(*b*) adapted to converting the light emitted by the LED into a light radiation in the wavelength range detected by the photosensitive diodes 171 of the device, for example, an infrared radiation.

Thus, LED 161(*b*) defines an emissive pixel PIR of a light source integrated to the optoelectronic device, adapted to cooperating with photosensitive diodes 171 and replacing the source 310 of the system of FIG. 3.

As previously described, the device of FIG. 4 may be a device of monolithic microdisplay type, or a pixel of a device of larger dimensions.

The number and the repetition pitch of pixels PIR may be selected according to the needs of the application. For example, the device may comprise fewer pixels PIR than visible pixels (defined by LEDs 161(*a*)) of a same emission color. Preferably, the final device (monolithic microdisplay or extended device) comprises a plurality of pixels PIR distributed over the surface of the device.

The conversion elements 181(*a*), 181(*b*) topping LEDs 161(*a*), 161(*b*) are for example formed based on quantum dots or based on perovskite materials, preferably inorganic perovskite materials, preferably epitaxial inorganic perovskite materials. The conversion elements based on perovskite materials are for example deposited by pulsed laser deposition (PLD).

Figure 5:
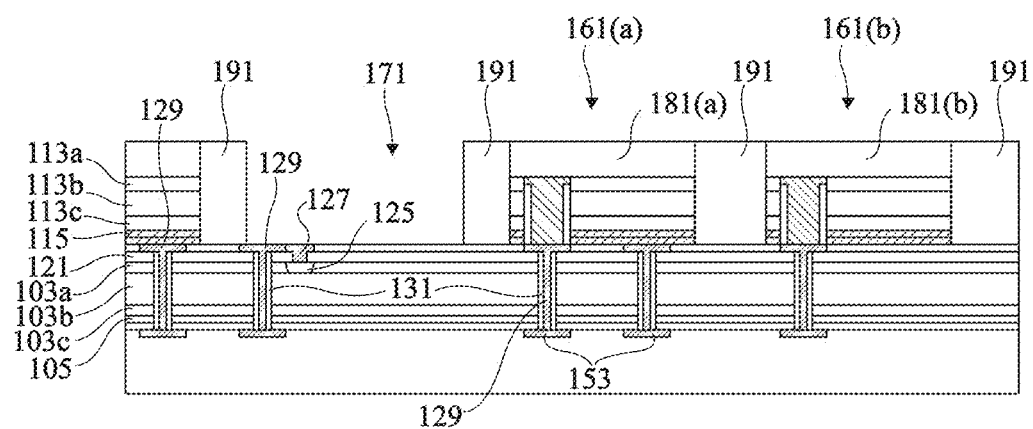
FIG. 5 is a cross-section view schematically and partially illustrating an alternative embodiment of the device of FIG. 4.

FIG. 5 is a cross-section view schematically and partially illustrating an alternative embodiment of the device of FIG. 4.

The variant of FIG. 5 differs from the example of FIG. 4 in that it further comprises opaque walls 191, for example, made of resin, laterally separating the emissive pixels from one another and laterally separating emissive pixels from detection pixels. This particularly enables to avoid for the light emitted by pixels PIR to directly reach photosensitive diodes 171, without passing through the scene, an image of which is desired to be acquired.

The invention claimed is:

1. Optoelectronic device manufacturing method, comprising the steps of:
   a) arranging an active photosensitive diode stack on a first substrate;
   b) transferring the active photosensitive diode stack onto an integrated control circuit previously formed inside and on top of a second semiconductor substrate, and then removing the first substrate;
   c) arranging an active light-emitting diode stack on a third substrate;
   d) after steps b) and c), transferring the active light-emitting diode stack onto the active photosensitive diode stack, and then removing the third substrate; and after step d), a step of local etching of the active light-emitting diode stack to form in the active light-emitting diode stack a plurality of tiles, each defining a light-emitting diode.

2. Method according to claim 1, wherein the active photosensitive diode stack comprises at least one inorganic semiconductor layer, for example, made of a III-V material, and wherein the active light-emitting diode stack comprises at least one inorganic semiconductor layer, for example, made of a III-V material.

3. Method according to claim 1, wherein the active photosensitive diode stack comprises first, second, and third semiconductor layers, the second layer being arranged between the first and third layers.

4. Method according to claim 3, comprising a step of P-type doping of local portions of the first layer, said portions defining anode regions of photosensitive diodes of the device.

5. Method according to claim 4, wherein said step of P-type doping of the local portions of the first layer is implemented after step b) and before step d).

6. Method according to claim 4, wherein said step of P-type doping of the local portions of the first layer is implemented before step b).

7. Method according to claim 4, further comprising a step of forming of connection metallizations on top of and in contact with said local portions of the first layer.

8. Method according to claim 1, wherein, at the end of step b), the active photosensitive diode stack continuously extends over the entire surface of the integrated control circuit.

9. Method according to claim 1, wherein, at the end of step d), the active light-emitting diode stack continuously extends over the entire surface of the integrated control circuit.

10. Method according to claim 1, further comprising, after step b) and before step d), a step of forming of conductive vias crossing the active photosensitive diode stack.

11. Method according to claim 10, wherein the conductive vias are electrically connected to metal connection pads of the integrated circuit.

12. Method according to claim 1, comprising the forming of color conversion elements, above at least some of the light-emitting diodes.

13. Method according to claim 12, wherein at least one of said light-emitting diodes is topped with a photoluminescent conversion element adapted to converting the light emitted by the light-emitting diode into a visible wavelength and at least another one of said light-emitting diodes is topped with a photoluminescent conversion element adapted to converting the light emitted by the light-emitting diode into a light radiation in the wavelength range of sensitivity of the active photosensitive diode stack, preferably an infrared radiation.

14. Method according to claim 13, wherein at least one of said light-emitting diodes is not topped with a photoluminescent conversion element.

15. Method according to claim 12, wherein said photoluminescent conversion elements, are formed based on quantum dots or on perovskite materials.

16. System comprising an optoelectronic device formed by a method according to claim 1, and a light source adapted to emitting a light radiation in the wavelength range of sensitivity of the active photosensitive diode stack, preferably an infrared radiation.

17. System according to claim 16, wherein the light source is a remote source.

18. System according to claim 16, wherein the light source is integrated to the optoelectronic device and comprises at least one light-emitting diode formed in the active light-emitting diode stack.

* * * * *